(12) United States Patent
Yamamoto et al.

(10) Patent No.: US 12,308,304 B2
(45) Date of Patent: May 20, 2025

(54) SEMICONDUCTOR DEVICE AND METHOD OF MANUFACTURING THE SAME, AND POWER CONVERSION DEVICE

(71) Applicant: Mitsubishi Electric Corporation, Tokyo (JP)

(72) Inventors: Kei Yamamoto, Tokyo (JP); Hodaka Rokubuichi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 538 days.

(21) Appl. No.: 17/294,685

(22) PCT Filed: Feb. 1, 2019

(86) PCT No.: PCT/JP2019/003666
§ 371 (c)(1),
(2) Date: May 18, 2021

(87) PCT Pub. No.: WO2020/157965
PCT Pub. Date: Aug. 6, 2020

(65) Prior Publication Data
US 2022/0020672 A1  Jan. 20, 2022

(51) Int. Cl.
*H01L 23/495* (2006.01)
*H01L 23/31* (2006.01)
*H01L 23/367* (2006.01)

(52) U.S. Cl.
CPC .... *H01L 23/49568* (2013.01); *H01L 23/3142* (2013.01); *H01L 23/3677* (2013.01)

(58) Field of Classification Search
CPC ........... H01L 23/49568; H01L 23/3142; H01L 23/3677; H01L 23/3121; H01L 23/4006;
(Continued)

(56) References Cited

U.S. PATENT DOCUMENTS 4,924,351 A  *  5/1990  Kato ................... H01L 23/3135
                                                       257/E23.052
5,105,259 A  *  4/1992  McShane ............ H01L 23/4334
                                                       257/667
(Continued)

FOREIGN PATENT DOCUMENTS

DE   10 2004 043 258 A1   4/2005
JP        2002373956 A  * 12/2002  ............. H01L 24/32
(Continued)

OTHER PUBLICATIONS

International Search Report and Written Opinion mailed on Apr. 16, 2019, received for PCT Application PCT/JP2019/003666, Filed on Feb. 1, 2019, 10 pages including English Translation.
(Continued)

*Primary Examiner* — Shaun M Campbell
*Assistant Examiner* — Teresa M. Arroyo
(74) *Attorney, Agent, or Firm* — XSENSUS

(57) ABSTRACT

A semiconductor device includes a heat sink, an insulating layer, a lead frame, a power semiconductor element, a sealing resin, and fins. The heat sink has a first main surface and a second main surface opposed to each other. A lead frame including a lead terminal is disposed on the first main surface of the heat sink with the insulating layer interposed. The power semiconductor element is mounted on the lead frame. The sealing resin is formed to cover an inside region located inside of an outer peripheral region located around the entire periphery along the outer periphery of the first main surface of the heat sink. A first depression is formed along the sealing resin in the outer peripheral region of the first main surface.

15 Claims, 12 Drawing Sheets

(58) Field of Classification Search
CPC ........... H01L 23/4334; H01L 23/49517; H01L 23/49551; H01L 23/49575; H01L 23/473; H01L 2924/181; H01L 21/565; H01L 2224/48091; H01L 25/072; H01L 25/07; H01L 25/18; H01L 2924/3512; H01L 2924/18301; H01L 2224/83051
USPC .......................................................... 257/667
See application file for complete search history.

(56) References Cited

U.S. PATENT DOCUMENTS

| | | | | |
|---|---|---|---|---|
| 5,598,034 | A * | 1/1997 | Wakefield | H01L 23/315 257/E23.128 |
| 5,701,034 | A * | 12/1997 | Marrs | H01L 24/49 257/E23.092 |
| 5,722,161 | A * | 3/1998 | Marrs | H01L 21/4882 29/841 |
| 5,753,969 | A * | 5/1998 | Suzuya | H01L 23/49503 257/667 |
| 5,872,395 | A * | 2/1999 | Fujimoto | H01L 23/4334 257/667 |
| 6,256,200 | B1 * | 7/2001 | Lam | H01L 24/35 361/813 |
| 2003/0197195 | A1 * | 10/2003 | Shim | H01L 23/10 257/E23.101 |
| 2004/0157366 | A1 * | 8/2004 | Kang | H01L 23/13 257/E23.092 |
| 2004/0232442 | A1 * | 11/2004 | Shimanuki | H01L 23/49503 257/199 |
| 2005/0263905 | A1 * | 12/2005 | Usui | H05K 3/4655 257/E23.125 |
| 2007/0057373 | A1 * | 3/2007 | Okumura | H01L 24/32 257/746 |
| 2010/0052149 | A1 * | 3/2010 | Nose | H01L 23/49513 257/692 |
| 2011/0074048 | A1 | 3/2011 | Shibita et al. | |
| 2011/0133329 | A1 * | 6/2011 | Takahashi | H01L 23/13 438/122 |
| 2014/0332951 | A1 * | 11/2014 | Nakamura | H01L 23/3142 257/712 |
| 2015/0084174 | A1 * | 3/2015 | van Straten | H01L 24/48 257/676 |
| 2015/0130042 | A1 | 5/2015 | Sato | |
| 2015/0235929 | A1 * | 8/2015 | Duca | H01L 23/49568 174/536 |
| 2015/0380338 | A1 | 12/2015 | Hori et al. | |

FOREIGN PATENT DOCUMENTS

| | | | |
|---|---|---|---|
| JP | 2008-149677 A | 7/2008 | |
| JP | 2008311366 A * | 12/2008 | ............ H01L 24/32 |
| JP | 2010-114257 A | 5/2010 | |
| JP | 2012-243941 A | 12/2012 | |
| JP | 2013-016606 A | 1/2013 | |
| JP | 2017-005149 A | 1/2017 | |
| TW | M249215 U | 11/2004 | |
| WO | 2009/150820 A1 | 12/2009 | |
| WO | 2013/141154 A1 | 9/2013 | |
| WO | 2014/174854 A1 | 10/2014 | |
| WO | 2018/055667 A1 | 3/2018 | |
| WO | 2018/061517 A1 | 4/2018 | |

OTHER PUBLICATIONS

Notice of Reasons for Refusal mailed on Sep. 24, 2019, received for JP Application 2019-540114, 6 pages including English Translation.
Office Action issued Dec. 12, 2023 in Chinese Patent Application No. 201980088017.8, 17 pages.
Office Action issued Jan. 15, 2024 in German Patent Application No. 11 2019 006 776.1, 17 pages.
Action issued May 9, 2024 in Chinese Patent Application No. 201980088017.8, 14 pages.
Chinese Office Action dated Sep. 5, 2024 issued in counterpart Chinese patent application No. CN201980088017.8 (16 pages; with English translation).

* cited by examiner

SEMICONDUCTOR DEVICE AND METHOD OF MANUFACTURING THE SAME, AND POWER CONVERSION DEVICE

CROSS-REFERENCE TO RELATED APPLICATION

The present application is based on PCT filing PCT/JP2019/003666, filed Feb. 1, 2019, the entire contents of which are incorporated herein by reference.

TECHNICAL FIELD

The present invention relates to a semiconductor device and a method of manufacturing the same, and a power conversion device.

BACKGROUND ART

Some semiconductor devices are equipped with power semiconductor elements which are heat-generating components. Semiconductor devices of this type involve heat generation from power semiconductor elements when being driven. The semiconductor devices therefore employ a relatively thick metal or ceramic substrate having a circuit pattern for efficiently dissipating the generated heat.

In order to further increase the heat dissipation area and enhance heat dissipation, for example, PTL 1 and PTL 2 propose a semiconductor device provided with a heat sink having a size larger than the size of a power module containing a power semiconductor element sealed with resin.

In a cooling structure of the power module proposed in PTL 1, a heat transfer member such as heat transfer grease is interposed between a power module containing a power semiconductor element sealed with resin and a radiator serving as a heat sink.

In the semiconductor device proposed in PTL 2, a semiconductor module containing a power semiconductor element sealed with resin and a cooler serving as a heat sink are bonded by bonding solder.

CITATION LIST

Patent Literature

PTL 1: Japanese Patent Laying-Open No. 2013-16606
PTL 2: Japanese Patent Laying-Open No. 2010-114257

SUMMARY OF INVENTION

Technical Problem

In the conventional semiconductor device provided with a heat sink having a size larger than the size of a power module, a lead terminal continuous to a lead frame protrudes from a side surface of the resin that seals the power semiconductor element. This makes it difficult to seal the heat sink, the power semiconductor element, and the like integrally with a mold for transfer molding.

For this reason, after the power semiconductor element is sealed with resin, the heat sink is mounted on the resin sealing the power semiconductor element, with a heat transfer member such as heat transfer grease or bonding solder interposed. Unfortunately, the thermal resistance of the heat transfer member such as heat transfer grease or the thermal resistance of the bonding solder is one of the factors that hinder further improvement in heat dissipation characteristics.

The present invention is made to solve the problem above. One object of the present invention is to provide a semiconductor device with improved heat dissipation characteristics. Another object is to provide a method of manufacturing such a semiconductor device. Yet another object is to provide a power conversion device to which such a semiconductor device is applied.

Solution to Problem

A semiconductor device according to the present invention includes a heat sink, a circuit pattern, a conductor part, a semiconductor element, and a sealing member. The heat sink has a first main surface and a second main surface opposed to each other. The circuit pattern is disposed at the first main surface of the heat sink with an insulating layer interposed. The conductor part is electrically connected to the circuit pattern. The semiconductor element is mounted on the circuit pattern and electrically connected to the circuit pattern. The sealing member is formed on the first main surface of the heat sink to seal the semiconductor element and the circuit pattern. The conductor part is exposed from a surface located on an opposite side to a side on which the heat sink is located in the sealing member. The sealing member is formed to cover an inside region located inside of an outer peripheral region located around an entire periphery along an outer periphery of the first main surface of the heat sink. The outer peripheral region in the first main surface of the heat sink has a first depression along the sealing member.

A method of manufacturing a semiconductor device according to the present invention includes the following steps. A heat sink having a first main surface and a second main surface opposed to each other is prepared. A circuit pattern is prepared. A semiconductor element is mounted on the circuit pattern, and the semiconductor element is electrically connected to the circuit pattern. A conductor part electrically connected to the circuit pattern is disposed toward an opposite side to a side on which the heat sink is to be disposed, relative to the circuit pattern. The circuit pattern electrically connected to the semiconductor element is mounted with an insulating layer interposed on the first main surface of the heat sink. A lower mold and an upper mold are prepared, the upper mold having a cavity to be filled with a sealing member for sealing the semiconductor element and the circuit pattern and a protrusion protruding toward the lower mold. The heat sink having the circuit pattern mounted thereon is disposed in the lower mold. The heat sink is sandwiched between the lower mold and the upper mold such that the semiconductor element and the circuit pattern are accommodated in the cavity. The cavity is filled with the sealing member to seal the semiconductor element and the circuit pattern. The lower mold and the upper mold are removed to expose the conductor part from a surface located on an opposite side to a side on which the heat sink is located in the sealing member. In the step of sandwiching the heat sink between the upper mold and the lower mold, a portion around an entire periphery along an outer periphery of the heat sink is sandwiched. A first depression corresponding to the protrusion is formed at a portion of the first main surface of the heat sink.

A power conversion device according to the present invention includes a main conversion circuit having the semiconductor device described above to convert input power and output the converted power, and a control circuit to output a control signal for controlling the main conversion circuit to the main conversion circuit.

Advantageous Effects of Invention

In the semiconductor device according to the present invention, the conductor part is exposed from a surface located on an opposite side to a side on which the heat sink is located in the sealing member. The sealing member is formed to cover an inside region located inside of an outer peripheral region located around the entire periphery along the outer periphery of the first main surface of the heat sink. With this configuration, heat generated in the semiconductor element is transferred to the heat sink more efficiently. As a result, the transferred heat can be dissipated efficiently, thereby improving the heat dissipation characteristics.

In the method of manufacturing a semiconductor device according to the present invention, in the step of sandwiching the heat sink between the upper mold and the lower mold, the portion around the entire periphery along the outer periphery of the heat sink is sandwiched, and the cavity is filled with the sealing resin. This method can produce a semiconductor device with improved heat dissipation characteristics.

In the power conversion device according to the present invention, the semiconductor device described above is applied to provide a power conversion device with high heat dissipation characteristics and high insulating performance.

DESCRIPTION OF EMBODIMENTS

First Embodiment

Figure 1:
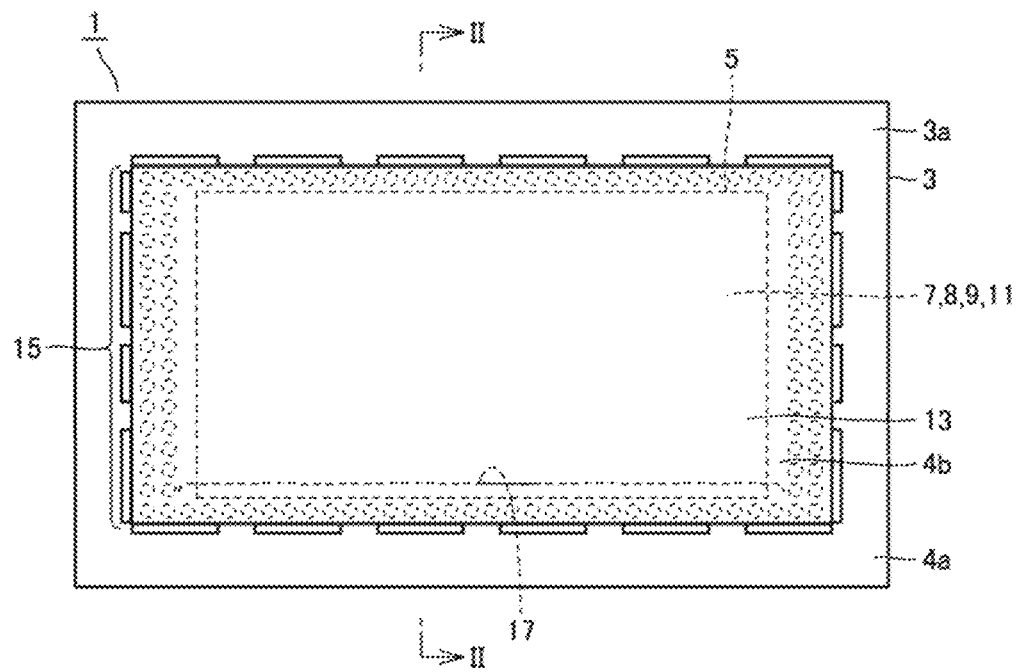
FIG. 1 is a top view of a semiconductor device according to a first embodiment of the present invention.
Figure 2:
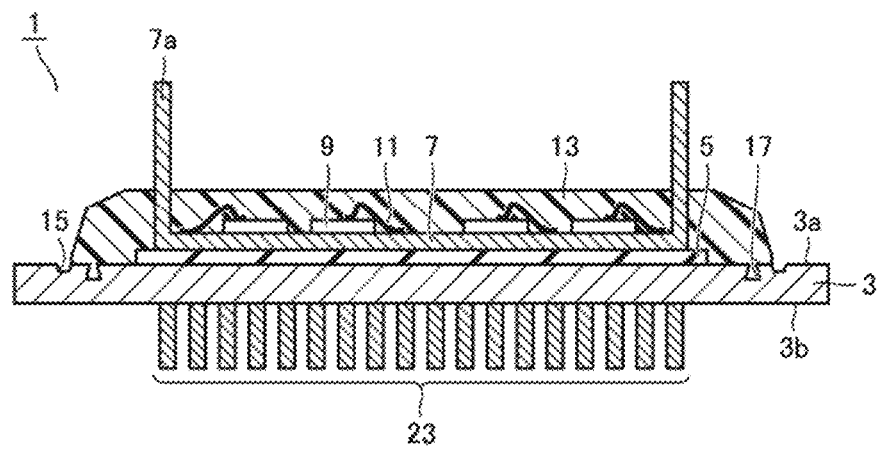
FIG. 2 is a cross-sectional view taken along line II-II shown in FIG. 1 in the first embodiment.

A semiconductor device according to a first embodiment will be described. As shown in FIG. 1 and FIG. 2, a semiconductor device 1 includes a heat sink 3, an insulating layer 5, a lead frame 7, a power semiconductor element 9, a sealing resin 13, and fins 23.

Heat sink 3 has a first main surface 3a and a second main surface 3b opposed to each other. On first main surface 3a of heat sink 3, lead frame 7 serving as a circuit pattern is disposed with insulating layer 5 interposed. Lead frame 7 includes a lead terminal 7a. Power semiconductor element 9 is mounted as a semiconductor element on lead frame 7. Power semiconductor element 9 is electrically connected to lead frame 7 by a bonding wire 11.

Sealing resin 13 is, for example, a mold resin made of epoxy resin for sealing lead frame 7, power semiconductor element 9, and the like and forms an outer shape of semiconductor device 1. Sealing resin 13 covers the first main surface 3a side of heat sink 3. Sealing resin 13 is not formed on the second main surface 3b side of heat sink 3.

Lead terminal 7a protrudes from a surface located on the opposite side to the side on which heat sink 3 is located in sealing resin 13. Lead terminal 7a is continuous as a conductor part to lead frame 7. On second main surface 3b of heat sink 3, a plurality of fins 23 are integrally disposed.

Components that constitute semiconductor device 1 will be specifically described. Heat sink 3 having insulating layer 5 on first main surface 3a functions as a metal plate. Heat sink 3 has sufficient heat dissipation performance because of fins 23 disposed on second main surface 3b.

Heat sink 3 is formed of, for example, a metal material, such as aluminum or copper, with a high thermal conductivity and with satisfactory heat dissipation performance. Fins 23 may be flat plate-like fins or pin-shaped fins. A first depression 15 formed in first main surface 3a of heat sink 3 is a depression produced when heat sink 3 is sandwiched between an upper mold and a lower mold such that sealing resin 13 does not leak out of a mold when sealing resin 13 is molded by heat and pressure with the mold.

Insulating layer 5 is formed from, for example, a thermosetting resin such as epoxy resin. To enhance the heat dissipation performance of insulating layer 5, the thermosetting resin is filled with a filler having a high heat conductivity. The heat conductive filler is preferably inorganic powder of silica, alumina, silicon nitride, aluminum nitride, or the like. Among inorganic powders of these materials, insulating layer 5 may be filled with inorganic powder of one material or may be filled with inorganic powders of two or more materials.

Since the thermosetting resin is often highly filled with inorganic powder in insulating layer 5 having higher heat dissipation performance, it is necessary to cure sealing resin 13 by heat and pressure under a high pressure in order to ensure the intrinsic thermal conductivity and insulating properties. When silicon nitride is added as inorganic powder, for example, the molding pressure for molding sealing resin 13 is sometimes about 5 MPa to 15 MPa.

Insulating layer 5 filled with such inorganic powder can be selected as appropriate, if necessary. When sealing resin 13 is cured by heat and pressure under a high molding pressure, such a measure as increasing the region of first depression 15 is necessary to prevent the sealing resin from leaking out of the die.

Lead frame 7 serving as a circuit pattern is formed from, for example, a stamped copper sheet. Power semiconductor element 9 mounted on lead frame 7 is not limited to a silicon-based power semiconductor element and may be, for example, a SiC-based power semiconductor element or a GaN-based power semiconductor element.

The member electrically connecting lead frame 7 and power semiconductor element 9 is not limited to bonding wire 11 and may be, for example, a direct lead formed from a copper plate. Lead terminal 7a that is an end portion of lead frame 7 is not exposed from the side surface of sealing resin 13 but is exposed to protrude from the surface on the opposite side to the side on which heat sink 3 is located in sealing resin 13 as described above.

Sealing resin 13 is formed to cover an inside region 4b located inside of an outer peripheral region 4a located around the entire periphery along the outer periphery of first main surface 3a of heat sink 3. First depression 15 is formed along sealing resin 13 in outer peripheral region 4a of first main surface 3a that is not covered with sealing resin 13. Burrs of sealing resin 13 may adhere to the surface of a part of outer peripheral region 4a of heat sink 3 where first depression 15 is not formed.

Figure 3:
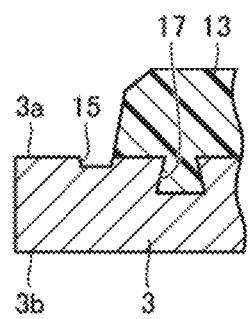
FIG. 3 is a partially enlarged cross-sectional view of the semiconductor device in the first embodiment.

As shown in FIG. 1 to FIG. 3, it is desirable that a second depression 17 is formed in inside region 4b of first main surface 3a of heat sink 3 that is covered with sealing resin 13. In a transfer molding process, second depression 17 is filled with sealing resin 13 to improve the adhesion between sealing resin 13 and heat sink 3 or crack resistance. For example, in a reliability test in which a test under high temperatures and a test under low temperatures are alternately performed (temperature cycle), separation of sealing resin 13 from heat sink 3 and cracking of sealing resin 13 is suppressed.

Although the shape (cross-sectional shape) of second depression 17 may be semicircular or rectangular, a shape that reduces the possibility that sealing resin 13 filled in second depression 17 is detached from second depression 17 is desirable. The method of forming second depression 17 is not limited to machining, and the second depression may be formed by forging or multistage pressing. In consideration of reliability or production cost, the method of forming second depression 17 can be selected as appropriate.

It is desirable that sealing resin 13 contains inorganic powder of, for example, silica or alumina. In sealing resin 13 containing such inorganic powder, the thermal expansion coefficient of sealing resin 13 can be closer to the thermal expansion coefficient of heat sink 3, the thermal expansion coefficient of the lead frame, and the thermal expansion coefficient of power semiconductor element 9, thereby suppressing warpage of the entire semiconductor device 1. Semiconductor device 1 according to the first embodiment is configured as described above.

Figure 4:
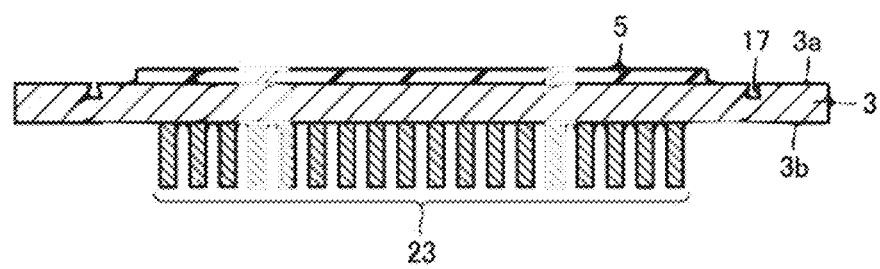
FIG. 4 is a cross-sectional view showing a step in a method of manufacturing a semiconductor device in the first embodiment.

An exemplary method of manufacturing the semiconductor device as described above will now be described. As shown in FIG. 4, heat sink 3 having first main surface 3a and second main surface 3b opposed to each other is prepared. Second main surface 3b of heat sink 3 is provided with a plurality of fins 23. First main surface 3a of heat sink 3 has second depression 17.

Subsequently, insulating layer 5 is formed by applying a resin composition (material) with a high thermal conductivity, for example, made of epoxy resin to a region where lead frame 7 (see FIG. 2) is to be mounted in first main surface 3a of heat sink 3. For example, a sheet-like resin composition may be pressed against and affixed to first main surface 3a of heat sink 3, rather than applying a resin composition.

Figure 5:
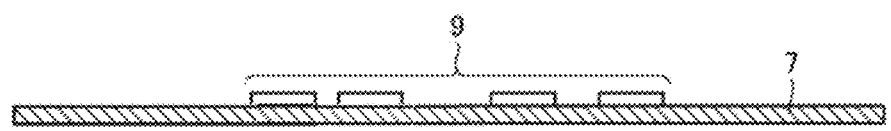
FIG. 5 is a cross-sectional view showing a step performed after the step shown in FIG. 4 in the first embodiment.

Subsequently, a lead frame is prepared, and solder paste is applied to a region where an electronic component such as a power semiconductor element is to be mounted. Subsequently, an electronic component is placed on the solder paste. Subsequently, as shown in FIG. 5, the electronic component such as power semiconductor element 9 is mounted on lead frame 7, for example, by a reflow process.

Figure 6:
FIG. 6 is a cross-sectional view showing a step performed after the step shown in FIG. 5 in the first embodiment.

Subsequently, as shown in FIG. 6, power semiconductor element 9 and the like is electrically connected to lead frame 7 by bonding wire 11. Instead of a bonding wire, for example, a direct lead such as a copper plate may be used. Subsequently, in lead frame 7, a portion serving as lead terminal 7a is bent upward (see FIG. 7). The electronic component may be mounted on lead frame 7 after a portion serving as lead terminal 7a in lead frame 7 is bent in advance.

Figure 7:
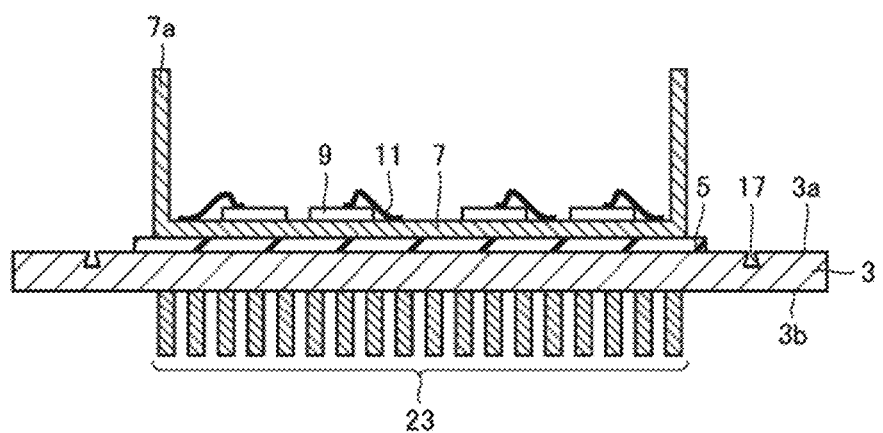
FIG. 7 is a cross-sectional view showing a step performed after the step shown in FIG. 6 in the first embodiment.
Figure 8:
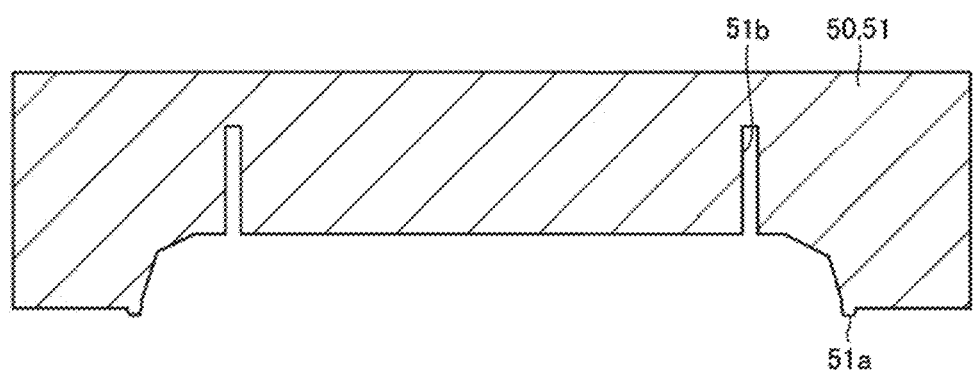
FIG. 8 is a cross-sectional view showing a step performed after the step shown in FIG. 7 in the first embodiment.
Figure 8:
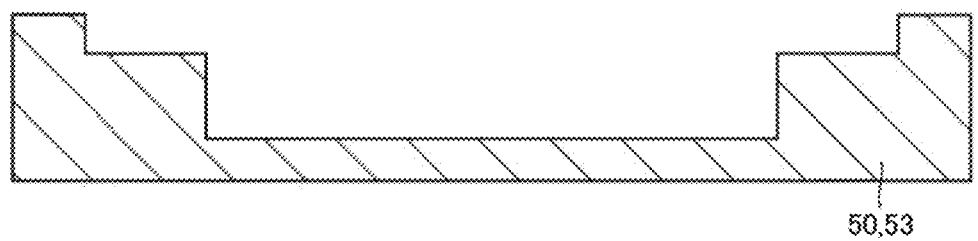

Subsequently, as shown in FIG. 7, lead frame 7 with power semiconductor element 9 and the like mounted thereon is mounted on insulating layer 5. Subsequently, as shown in FIG. 8, an upper mold 51 and a lower mold 53 are prepared as a mold 50 for transfer molding. Upper mold 51 has a protrusion 51a protruding toward lower mold 53 for preventing leakage of sealing resin to be filled in the cavity. Upper mold 51 also has a receiving hole 51b for receiving the lead terminal.

Figure 9:
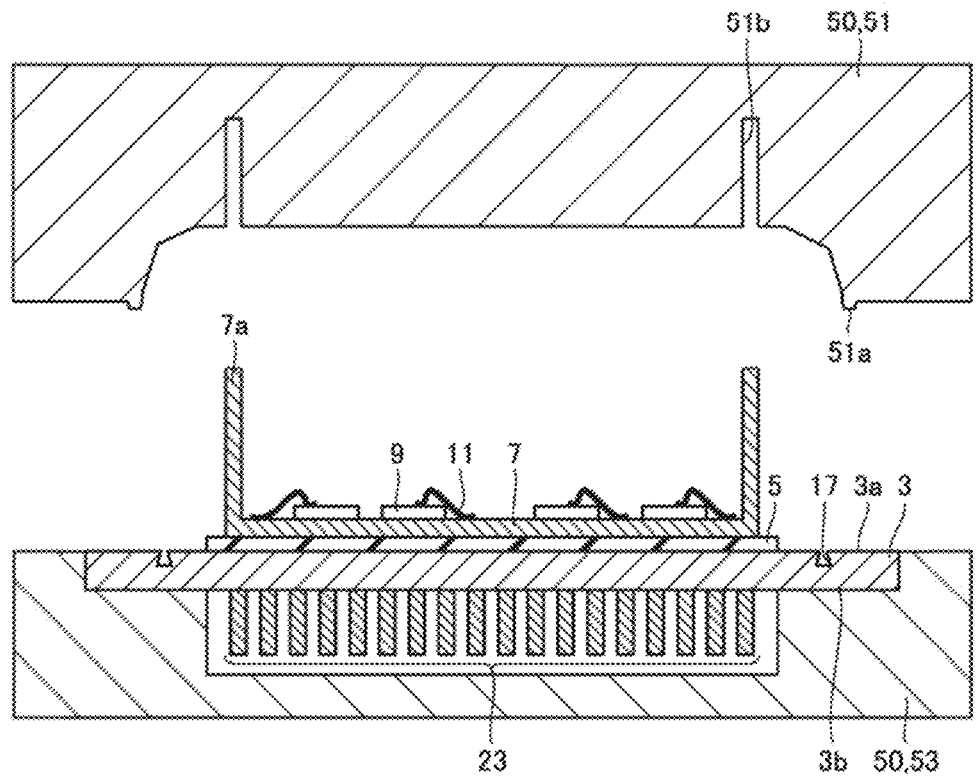
FIG. 9 is a cross-sectional view showing a step performed after the step shown in FIG. 8 in the first embodiment.
Figure 10:
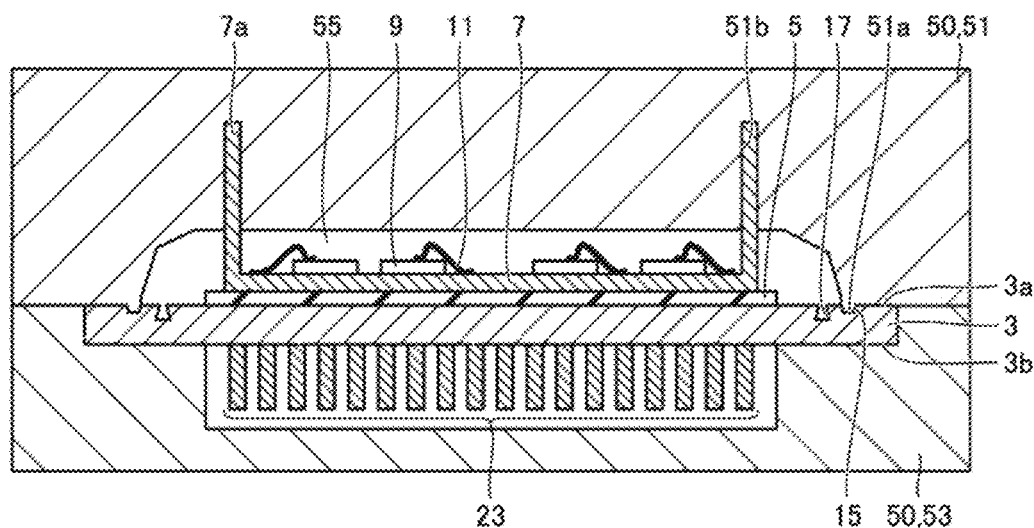
FIG. 10 is a cross-sectional view showing a step performed after the step shown in FIG. 9 in the first embodiment.

Subsequently, as shown in FIG. 9, heat sink 3 with lead frame 7 and the like mounted thereon is placed in lower mold 53. Subsequently, as shown in FIG. 10, upper mold 51 is brought closer to lower mold 53 so that the outer peripheral portion of heat sink 3 is sandwiched between upper mold 51 and lower mold 53. In first main surface 3a, a region in abutment with upper mold 51 becomes outer peripheral region 4a (see FIG. 1).

At this moment, lead terminal 7a is inserted into receiving hole 51b of upper mold 51. Here, a mechanism for changing the width of receiving hole 51b may be provided in upper mold 51. When heat sink 3 is sandwiched between upper mold 51 and lower mold 53, this mechanism sets the opening width of receiving hole 51b to a state sufficiently wider than the thickness of lead terminal 7a, thereby facilitating insertion of lead terminal 7a into the receiving hole 51b. After lead terminal 7a is inserted into receiving hole 51b, the opening width of receiving hole 51b is adjusted to the thickness of lead terminal 7a so that sealing resin 13 (see FIG. 11) can be poured.

A mated surface at which upper mold 51 and lower mold 53 are mated is substantially matched with a plane on which first main surface 3a of heat sink 3 is located. Here, the pressure to sandwich heat sink 3 is adjusted such that protrusion Ma formed on upper mold 51 penetrates into first main surface 3a of heat sink 3.

Figure 11:
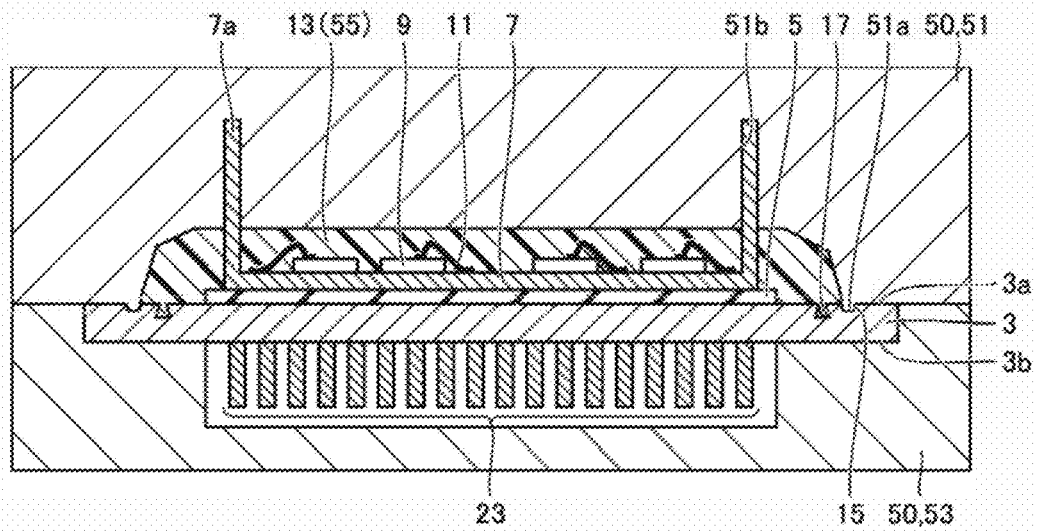
FIG. 11 is a cross-sectional view showing a step performed after the step shown in FIG. 10 in the first embodiment.

Subsequently, as shown in FIG. 11, sealing resin 13 is poured into a cavity 55. At this moment, since protrusion 51a of upper mold 51 penetrates into first main surface 3a of heat sink 3, sealing resin 13 can be prevented from leaking out of cavity 55 toward the mated surface between first main surface 3a of heat sink 3 and upper mold 51.

Sealing resin 13 is heated and cured in mold 50 (cavity 55). After sealing resin 13 is cured, semiconductor device 1 is removed from mold 50. Subsequently, an additional thermal setting process may be performed with an oven or the like, if necessary, to further harden sealing resin 13.

Figure 12:
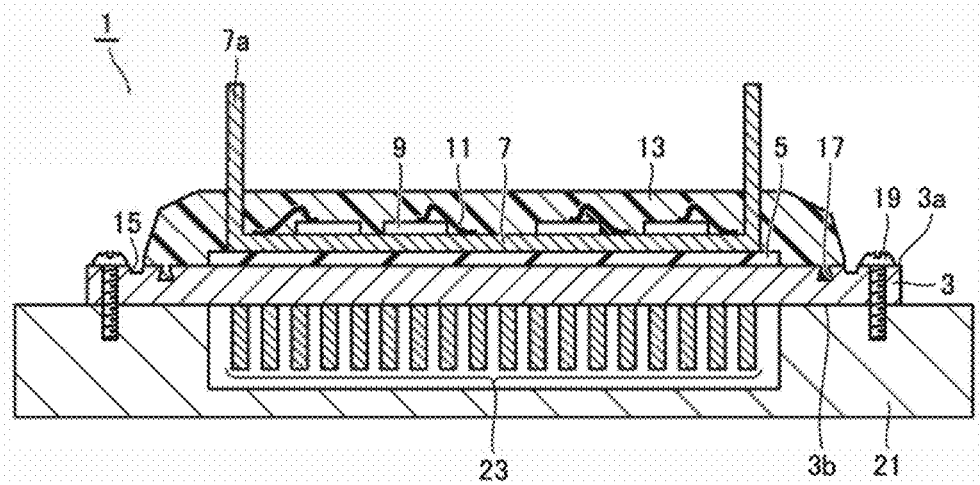
FIG. 12 is a cross-sectional view showing an exemplary manner of use of the semiconductor device in the first embodiment.

As shown in FIG. 12, in semiconductor device 1 subjected to the thermal setting process, semiconductor device 1 is installed in a casing 21 to employ an air cooling structure or a water cooling structure. Semiconductor device 1 may be installed in casing 21, for example, by fixing heat sink 3 to casing 21 by screws 19. Alternatively, heat sink 3 may be fixed to casing 21, for example, by welding or friction stir welding.

In semiconductor device 1 described above, sealing resin 13 that seals power semiconductor element 9 and the like is directly formed on first main surface 3a of heat sink 3 so that sealing resin 13 and heat sink 3 are integrated. Furthermore, sealing resin 13 is formed to cover inside region 4b located inside of outer peripheral region 4a located around the entire periphery along the outer periphery of first main surface 3a of heat sink 3, and the area of heat sink 3 two-dimensionally viewed is larger than the area of sealing resin 13 two-dimensionally viewed.

Heat transfer grease or the like need not to be applied and accordingly, thermal resistance is reduced, so that heat generated in power semiconductor element 9 and the like is transferred to heat sink 3 more efficiently. As a result, the transferred heat can be dissipated efficiently, thereby improving the heat dissipation characteristics.

Since sealing resin 13 and heat sink 3 are integrated, there is no need for attaching heat sink 3 after sealing resin 13 that seals the power semiconductor element and the like is molded. This contributes to reduction of manufacturing steps.

Furthermore, lead terminal 7a protrudes not from the side surface of sealing resin 13 but from the upper surface of sealing resin 13 upward, and lead terminal 7a protrudes from the surface located on the opposite side to the side on which heat sink 3 is located in sealing resin 13. This configuration contributes to size reduction of semiconductor device 1.

Furthermore, when sealing resin 13 is formed integrally on heat sink 3, the outer peripheral portion of heat sink 3 is sandwiched between upper mold 51 and lower mold 53 such that the mated surface between upper mold 51 and lower mold 53 is substantially matched with the plane on which first main surface 3a of heat sink 3 is located, and protrusion 51a of upper mold 51 penetrates into first main surface 3a of heat sink 3.

This configuration prevents sealing resin 13 filled in cavity 55 from leaking toward the mated surface between first main surface 3a of heat sink 3 and upper mold 51. Protrusion 51a of upper mold 51 penetrates into first main surface 3a of heat sink 3, whereby first depression 15 is formed in first main surface 3a along sealing resin 13.

When sealing resin 13 is integrally formed on heat sink 3, part of sealing resin 13 filled in cavity 55 also fills second depression 17 formed in first main surface 3a of heat sink 3. This can improve the adhesion between sealing resin 13 and heat sink 3.

Figure 13:
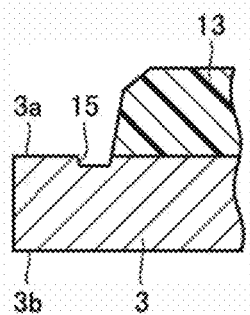
FIG. 13 is a partially enlarged cross-sectional view of the semiconductor device according to a modification in the first embodiment.

In semiconductor device 1 described above, second depression 17 is formed in first main surface 3a of heat sink 3. As shown in FIG. 13, heat sink 3 in which the second depression is not formed in first main surface 3a may be employed as heat sink 3.

Figure 14:
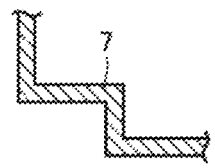
FIG. 14 is a partially enlarged cross-sectional view showing a lead frame of the semiconductor device according to another modification in the first embodiment.
Figure 15:
FIG. 15 is a partially enlarged cross-sectional view showing a lead frame of the semiconductor device according to yet another modification in the first embodiment.

In semiconductor device 1 described above, lead frame 7 is bent once to be exposed from the surface of sealing resin 13. The structure of lead frame 7 may be changed as appropriate, for example, in consideration of the insulation distance between lead frame 7 and heat sink 3 or the connection to a direct lead. As shown in FIG. 14, for example, lead frame 7 may bent in multiple steps. As shown in FIG. 15, lead frame 7 may be embossed by a length equivalent to about half of its thickness.

Second Embodiment

Figure 16:
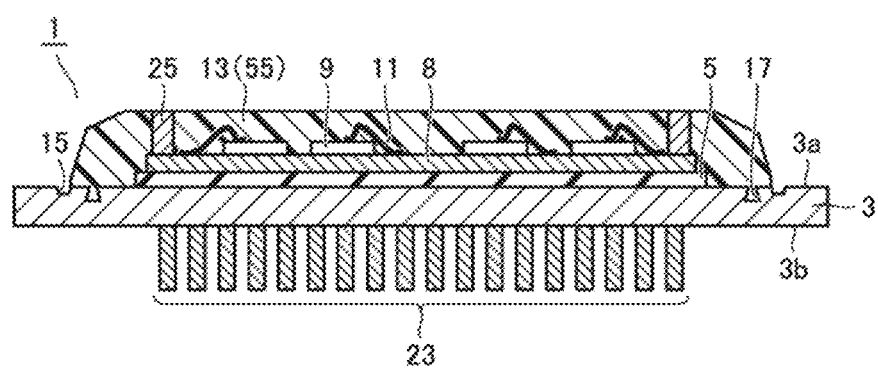
FIG. 16 is a cross-sectional view of a semiconductor device according to a second embodiment of the present invention.

A semiconductor device according to a second embodiment will be described. As shown in FIG. 16, in semiconductor device 1, for example, a pattern of a copper plate 8 is disposed on first main surface 3a of heat sink 3 with insulating layer 5 interposed. A metal conductor 25 is electrically connected as a conductor part to copper plate 8.

Metal conductor 25 is exposed on a surface located on the opposite side to the side on which heat sink 3 is located in sealing resin 13. The other configuration is similar to the configuration of semiconductor device 1 shown in FIG. 1 and FIG. 2, and the same member is denoted by the same reference sign and will not be further elaborated unless necessary.

Figure 17:
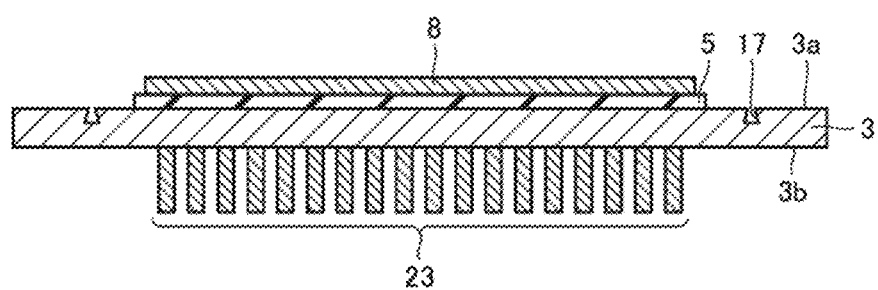
FIG. 17 is a cross-sectional view of a method of manufacturing a semiconductor device in the second embodiment.
Figure 18:
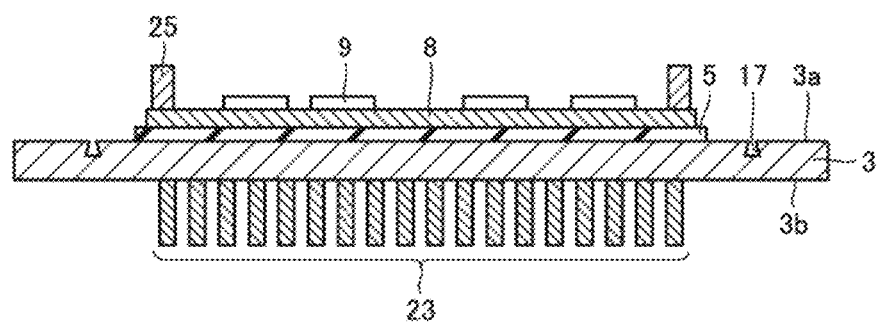
FIG. 18 is a cross-sectional view showing a step performed after the step shown in FIG. 17 in the second embodiment.
Figure 19:
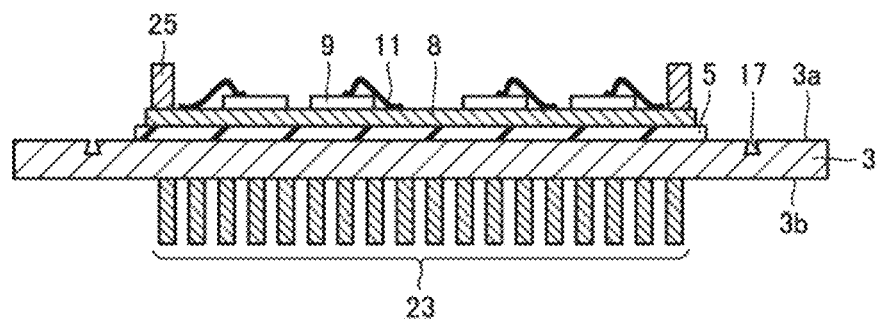
FIG. 19 is a cross-sectional view showing a step performed after the step shown in FIG. 18 in the second embodiment.

An exemplary method of manufacturing the semiconductor device as described above will now be described. As shown in FIG. 17, copper plate 8 is placed at first main surface 3a of heat sink 3 with insulating layer 5 interposed, and press work (heating and pressing) is performed to cure insulating layer 5. Subsequently, an etching process is performed on copper plate 8 to form a circuit pattern of copper plate 8. Subsequently, as shown in FIG. 18, power semiconductor element 9 and metal conductor 25 are soldered to copper plate 8. Subsequently, as shown in FIG. 19, power semiconductor element 9 and the like is electrically connected to copper plate 8 by bonding wire 11.

Figure 20:
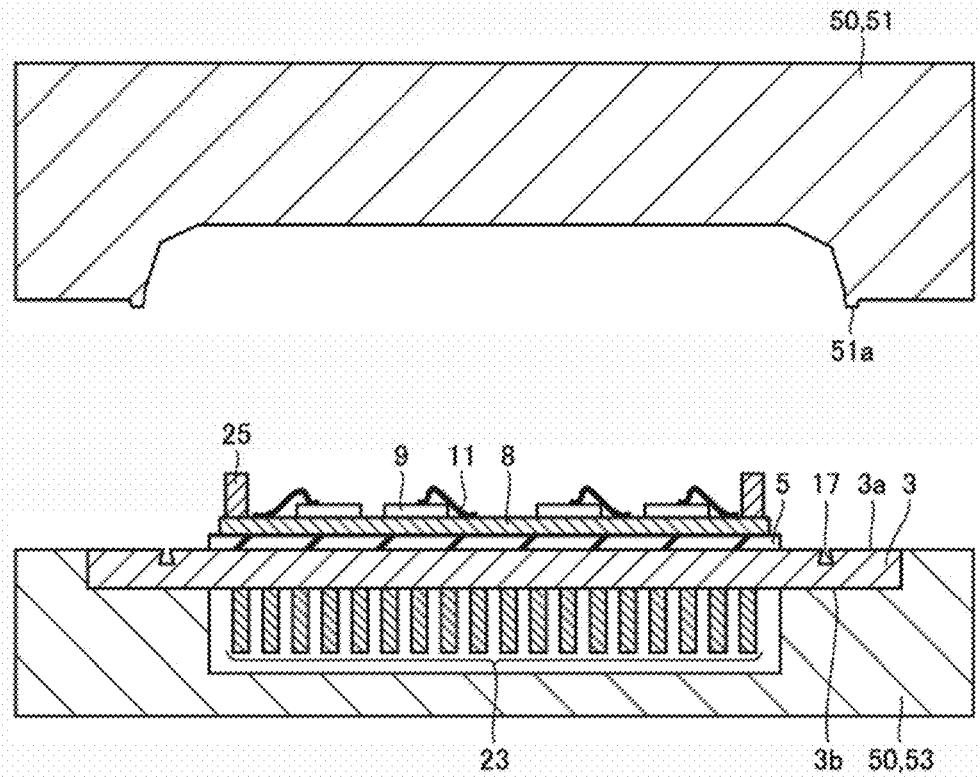
FIG. 20 is a cross-sectional view showing a step performed after the step shown in FIG. 19 in the second embodiment.
Figure 21:
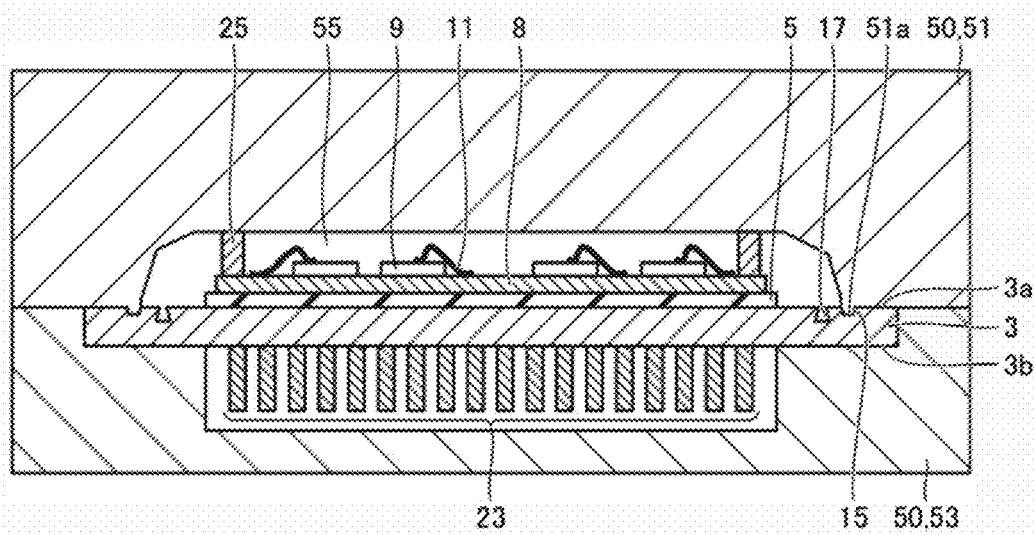
FIG. 21 is a cross-sectional view showing a step performed after the step shown in FIG. 20 in the second embodiment.

Subsequently, as shown in FIG. 20, heat sink 3 having copper plate 8 and the like mounted thereon is placed in lower mold 53. Subsequently, as shown in FIG. 21, upper mold 51 is brought closer to lower mold 53 so that the outer peripheral portion of heat sink 3 is sandwiched between upper mold 51 and lower mold 53. Here, the pressure to sandwich heat sink 3 is adjusted such that protrusion 51a formed on upper mold 51 penetrates into first main surface 3a of heat sink 3.

Figure 22:
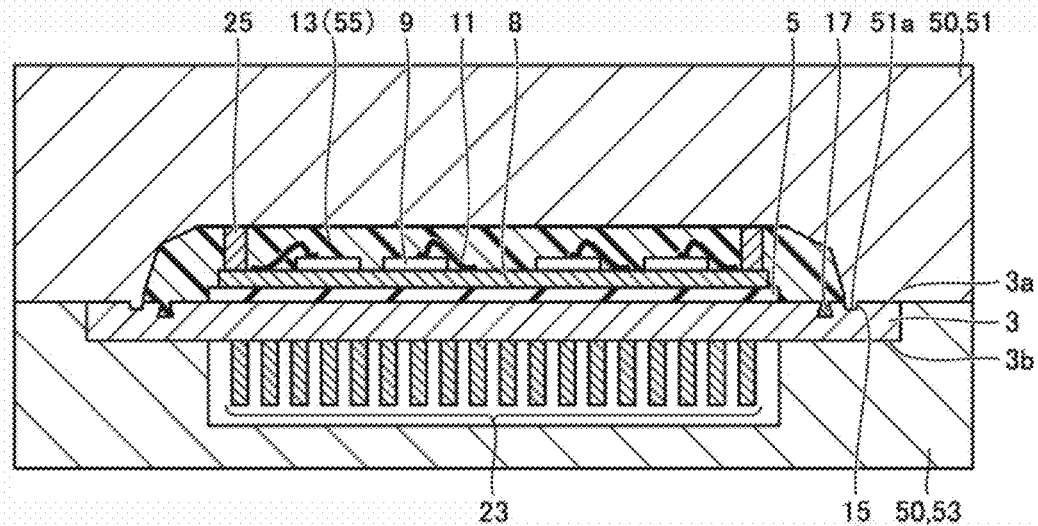
FIG. 22 is a cross-sectional view showing a step performed after the step shown in FIG. 21 in the second embodiment.

Subsequently, as shown in FIG. 22, sealing resin 13 is poured into cavity 55. Sealing resin 13 is heated and cured in mold 50 (cavity 55). After sealing resin 13 is cured, semiconductor device 1 is removed from mold 50, resulting in semiconductor device 1 shown in FIG. 16.

In semiconductor device 1 described above, similar to semiconductor device 1 previously described, sealing resin 13 and heat sink 3 are integrated, and the area of heat sink 3 two-dimensionally viewed is larger than the area of sealing resin 13 two-dimensionally viewed. With this configuration, heat generated in power semiconductor element 9 and the like can be transferred to heat sink 3 more efficiently. As a result, the transferred heat can be dissipated efficiently, thereby improving the heat dissipation characteristics.

Similarly to semiconductor device 1 previously described, there is no need for attaching heat sink 3 after sealing resin 13 that seals the power semiconductor element 9 and the like is molded. This contributes to reduction of manufacturing steps. Furthermore, metal conductor 25 protrudes not from the side surface of sealing resin 13 but from the upper surface upward. This configuration contributes to size reduction of semiconductor device 1.

In the method of manufacturing a semiconductor device described above, compared with the method of manufacturing a semiconductor device previously described, the height of metal conductor 25 from heat sink 3 may vary due to variations in finished dimensions at the time of soldering metal conductor 25 to copper plate 8, or dimensional variations of metal conductor 25.

Therefore, in order to fill cavity 55 with sealing resin 13 in a state in which heat sink 3 is sandwiched reliably between upper mold 51 and lower mold 53, it is desirable to use a heat-resistant film capable of absorbing tolerance (variation) in height of metal conductor 25 from heat sink 3. This process will be described.

Figure 23:
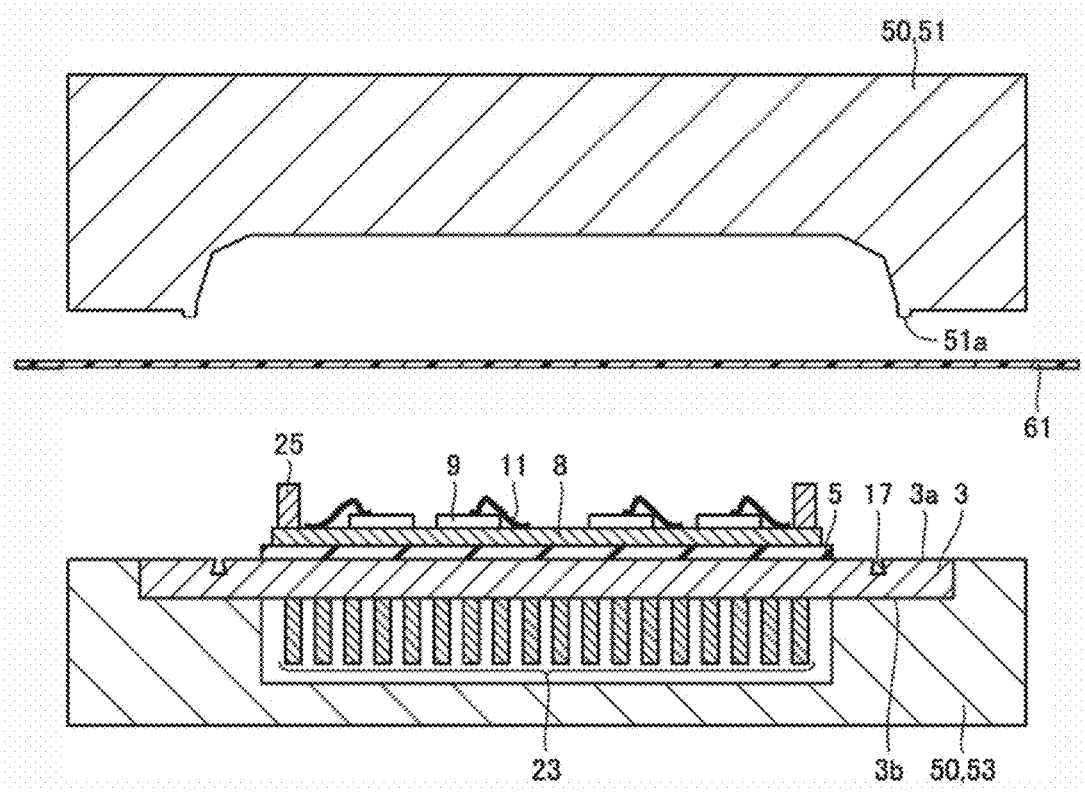
FIG. 23 is a cross-sectional view showing a step in a modification to the method of manufacturing a semiconductor device in the second embodiment.
Figure 24:
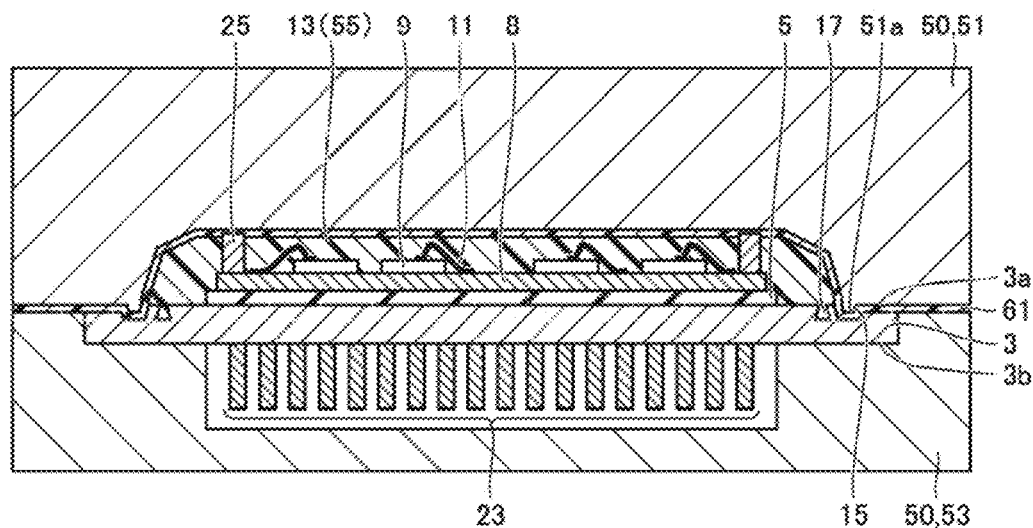
FIG. 24 is a cross-sectional view showing a step performed after the step shown in FIG. 23 in the second embodiment.

As shown in FIG. 23, a heat-resistant film 61 is disposed between upper mold 51 and lower mold 53 having heat sink 3 and the like therein. Subsequently, heat-resistant film 61 is conformed to the surface of cavity 55, for example, by vacuum suction, and heat sink 3 is sandwiched between upper mold 51 and lower mold 53 (see FIG. 24). Subsequently, as shown in FIG. 24, cavity 55 is filled with sealing resin 13. After sealing resin 13 is heated and cured, semiconductor device 1 is removed from mold 50.

In the manufacturing method using the heat-resistant film, heat-resistant film 61 disposed between metal conductor 25 and upper mold 51 serves as a cushion member. Therefore, in a case where metal conductor 25 whose height from heat sink 3 is larger than a reference height is disposed, when heat sink 3 is sandwiched between upper mold 51 and lower mold 53, metal conductor 25 penetrates into heat-resistant film 61, thereby alleviating the pressure acting on metal conductor 25 from upper mold 51. As a result, damage to the bonded portion between metal conductor 25 and copper plate 8 and damage to insulating layer 5 located under copper plate 8 can be suppressed.

In the thus manufactured semiconductor device 1, an upper portion of metal conductor 25 slightly projects from the surface of sealing resin 13. After semiconductor device 1 is manufactured, heat-resistant film 61 left in upper mold 51 is collected and wasted.

Third Embodiment

In semiconductor device 1 previously described, a plurality of fins 23 are disposed integrally on second main surface 3b of heat sink 3. Here, a semiconductor device in which a heat sink and a plurality of fins are provided separately will be described.

Figure 25:
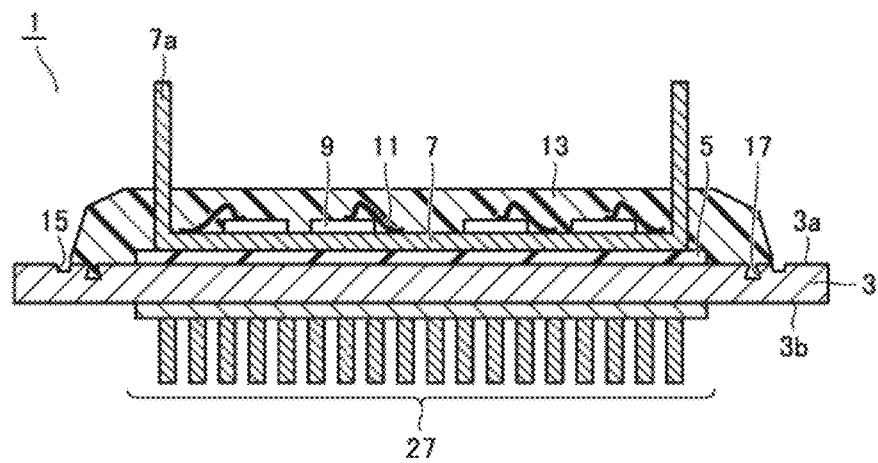
FIG. 25 is a cross-sectional view of an exemplary semiconductor device according to a third embodiment of the present invention.
Figure 26:
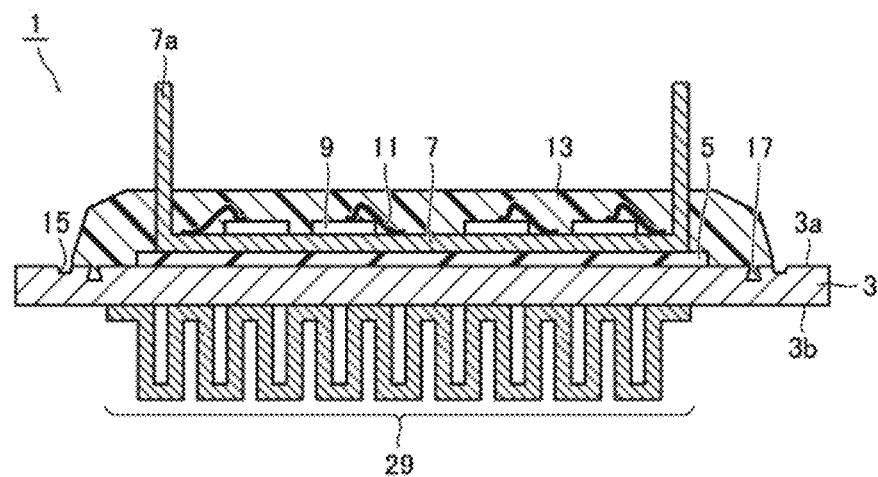
FIG. 26 is a cross-sectional view of another exemplary semiconductor device in the third embodiment.

As shown in FIG. 25, for example, flat-plate fins 27 are bonded to the second main surface 3b side of heat sink 3 in semiconductor device 1. As shown in FIG. 26, for example, a corrugated fin 29 is bonded to the second main surface 3b side of heat sink 3 in semiconductor device 1.

For example, relatively inexpensive fins manufactured by extrusion of aluminum may be employed as those fins such as flat-plate fins 27 or corrugated fin 29. Alternatively, a flexible fin structure may be employed in which an aluminum thin plate is folded into the shape of fins. The fins separate from heat sink 3 can be bonded to heat sink 3 by solder bonding, laser welding, or fitting by crimping, or the like.

Figure 27:
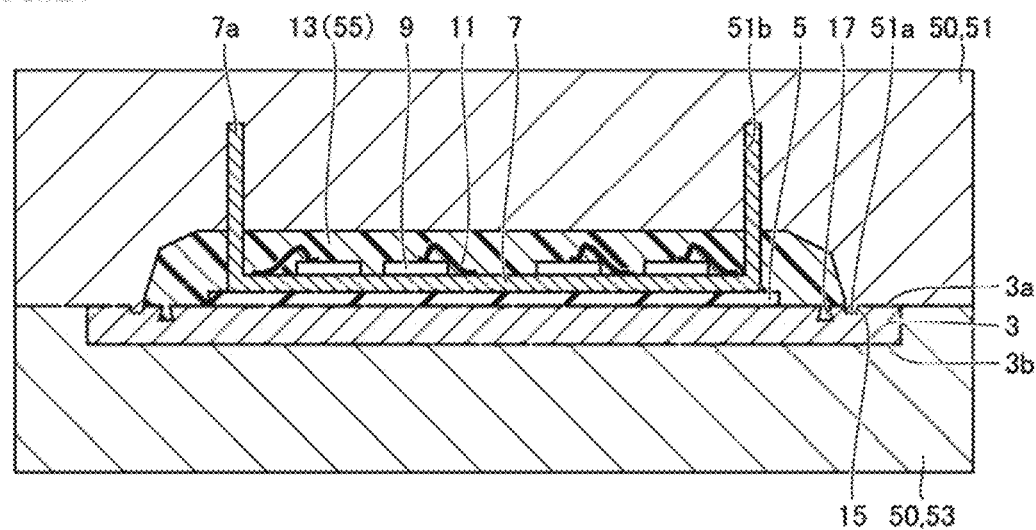
FIG. 27 is a cross-sectional view showing a step of a method of manufacturing a semiconductor device in the third embodiment.

In the semiconductor device in which the heat sink is separate from a plurality of fins, the molding pressure of the sealing resin can be increased in the transfer molding process. This process will be described. As shown in FIG. 27, since heat sink 3 is separate from a plurality of fins, lower mold 53 in which heat sink 3 is to be placed can be brought into contact with the entire second main surface 3b of heat sink 3.

This configuration can reliably prevent the heat sink from being deformed by the molding pressure for charging sealing resin 13 into cavity 55 for molding. As a result, a higher molding pressure can be set, compared with using lower mold 53 (see FIG. 10 and the like) in which heat sink 3 having a plurality of fins 23 disposed thereon is placed.

In order to ensure the intrinsic thermal conductivity and insulating properties of insulating layer 5 interposed between heat sink 3 and lead frame 7, the more inorganic powder is contained, the higher pressure curing is required when resin such as epoxy resin serving as a base of insulating layer 5 is heated and cured. In particular, the shape of inorganic powder has a significant influence on pressure curing. When silicon nitride is contained in insulating layer 5, compared with when silica or alumina is contained in insulating layer 5, the flowability of insulating layer 5 is low because of the non-spherical shape of silicon nitride, and a high pressure is often required to develop the intrinsic thermal conductivity or other characteristics.

When insulating layer 5 is heated and pressed to be cured in the cavity using a mold for transfer molding, a heat sink separate from a plurality of fins can be employed as the heat sink so that insulating layer 5 is cured under a higher pressure and a higher thermal conductivity is ensured for insulating layer 5.

When silicon nitride is employed as inorganic powder, the ratio in volume of silicon nitride (the volume ratio of silicon nitride) to the volume of the insulating layer containing silicon nitride is set to less than 40% by volume to ensure the intrinsic thermal conductivity and insulating properties at a molding pressure of about 5 MPa at the time of heating and curing. The thermal conductivity is about 2 to 5 W/(m·K). When the volume ratio of silicon nitride is 40% by volume or more and less than 50% by volume, a molding pressure of about 10 MPa is required, and the thermal conductivity is about 4 to 6 W/(m·K).

When the volume ratio of silicon nitride is 50% by volume or more and less than 60% by volume, a thermal conductivity up to 5 to 14 W/(m·K) can be developed. In this case, a molding pressure as high as 10 MPa or more is required. Then, as shown in FIG. 27, lower mold 53 brought into contact with the entire second main surface 3b of heat sink 3 can be employed to produce a more reliable semiconductor device excellent in insulating properties and thermal conductivity.

Fourth Embodiment

A power conversion device to which the semiconductor device described in the foregoing first to third embodiments is applied will now be described. Although the present invention is not limited to a specific power conversion device, a three-phase inverter to which the present invention is applied will be described below as a fourth embodiment.

Figure 28:
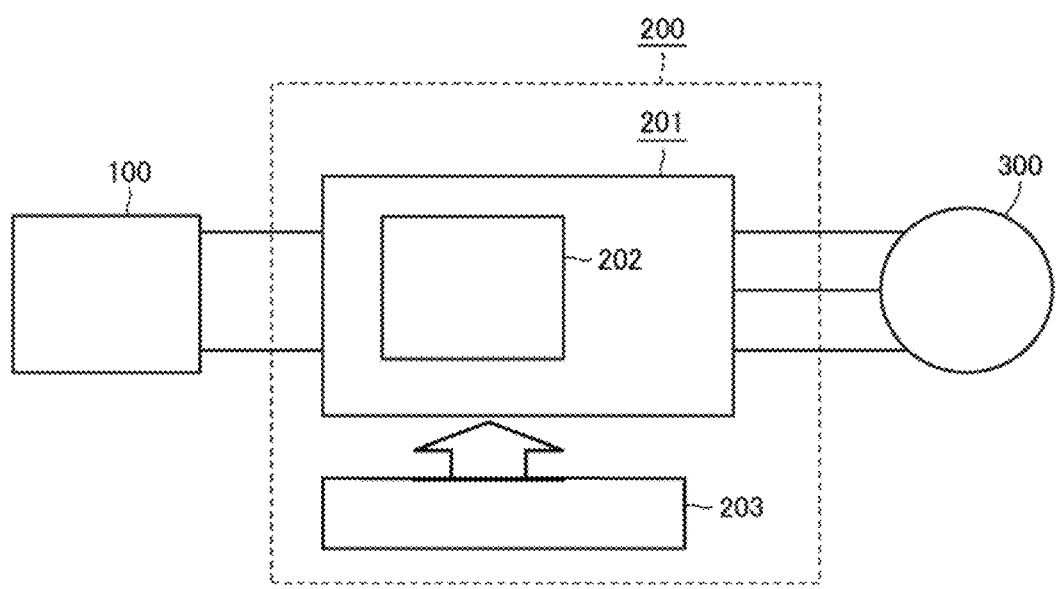
FIG. 28 is a block diagram of a power conversion device according to a fourth embodiment of the present invention.

FIG. 28 is a block diagram showing a configuration of a power conversion system to which a power conversion device according to the present embodiment is applied. The power conversion system shown in FIG. 28 includes a power supply 100, a power conversion device 200, and a load 300. Power supply 100 is a direct-current power supply and supplies DC power to power conversion device 200. Power supply 100 can be configured with a variety of power supplies, for example, can be configured with a DC system, a solar cell, or a storage battery. Power supply 100 may be configured with a rectifying circuit or an AC/DC converter connected to an AC system. Power supply 100 may be configured with a DC/DC converter that converts DC power output from a DC system into a predetermined power.

Power conversion device 200 is a three-phase inverter connected between power supply 100 and load 300, converts DC power supplied from power supply 100 into AC power, and supplies the AC power to load 300. As shown in FIG. 28, power conversion device 200 includes a main conversion circuit 201 to convert DC power into AC power and output the AC power and a control circuit 203 to output a control signal for controlling main conversion circuit 201 to main conversion circuit 201.

Load 300 is a three-phase electric motor driven by AC power supplied from power conversion device 200. Load 300 is not limited to a specific application and is an electric motor installed in a variety of electric devices, for example, used as an electric motor for a hybrid vehicle, an electric vehicle, a rail vehicle, an elevator, or an air conditioner.

The detail of power conversion device 200 is described below. Main conversion circuit 201 includes switching elements and freewheel diodes (neither shown). The switching elements are switched whereby DC power supplied from power supply 100 is converted into AC power, which is in turn supplied to load 300. Although there are a variety of specific circuit configurations of main conversion circuit 201, main conversion circuit 201 according to the present embodiment is a two-level three-phase full-bridge circuit and configured with six switching elements and six freewheel diodes connected in anti-parallel with the respective switching elements.

Semiconductor device 1 according to at least one of the foregoing first to third embodiments is applied as semiconductor module 202 in at least one of the switching elements and the freewheel diodes of main conversion circuit 201. The six switching elements are connected two by two in series to form upper and lower arms, and the upper and lower arms constitute each phase (U phase, V phase, W phase) of the full-bridge circuit. The output terminals of the upper and lower arms, that is, three output terminals of main conversion circuit 201 are connected to load 300.

Main conversion circuit 201 includes a drive circuit (not shown) for driving each switching element. The drive circuit may be contained in semiconductor module 202 or the drive circuit may be provided separately from semiconductor module 202. The drive circuit generates a drive signal for driving a switching element of main conversion circuit 201 and supplies the drive signal to the control electrode of the switching element of main conversion circuit 201. Specifically, in accordance with a control signal from control circuit 203 described later, a drive signal for turning on a switching element and a drive signal for turning off a switching element are output to the control electrode of each switching element. When the switching element is to be kept on, the drive signal is a voltage signal (ON signal) equal to or higher than a threshold voltage of the switching element. When the switching element is to be kept off, the drive signal is a voltage signal (OFF signal) equal to or lower than a threshold voltage of the switching element.

Control circuit 203 controls the switching elements of main conversion circuit 201 such that a desired power is supplied to load 300. Specifically, the time (ON time) during which each switching element of main conversion circuit 201 is to be turned on is calculated based on power to be supplied to load 300. For example, main conversion circuit 201 can be controlled by PWM control that modulates the ON time of the switching elements in accordance with a voltage to be output. Then, a control command (control signal) is output to the drive circuit of main conversion circuit 201 such that an ON signal is output to a switching element to be turned on and an OFF signal is output to a switching element to be turned off, at each point of time. The drive circuit outputs an ON signal or an OFF signal as a drive signal to the control electrode of each switching element in accordance with this control signal.

In the power conversion device according to the present embodiment, semiconductor device 1 according to the foregoing first to third embodiments is applied as semiconductor module 202 in at least one of the switching elements and the freewheel diodes of main conversion circuit 201, so that the electrical insulating properties are improved and the reliability of the power conversion device is thereby improved.

In the present embodiment, an example in which the present invention is applied to a two-level three-phase inverter has been described. However, the present invention is not limited thereto and is applicable to a variety of power conversion devices. Although the present invention is applied to a two-level power conversion device in the present embodiment, the present invention may be applied to a three-level or multi-level power conversion device, or the present invention may be applied to a single-phase inverter when power is supplied to a single-phase load. When power is supplied to a DC load or the like, the present invention can be applied to a DC/DC converter or an AC/DC converter.

The power conversion device employing the present invention is not limited to a case where the load is an electric motor, and can be used as, for example, a power supply device for an electric spark machine, a laser beam machine, an induction heating cooker, or a wireless charging system, or used as a power conditioner for a photovoltaic system or a power storage system.

The semiconductor devices described in the embodiments can be combined in various ways, if necessary. A variety of dependent claims corresponding to such combinations are intended to be embraced in the claims.

Embodiments disclosed here should be understood as being illustrative rather than being limitative. The scope of the present invention is shown not in the foregoing description but in the claims, and it is intended that all modifications that come within the meaning and range of equivalence to the claims are embraced here.

INDUSTRIAL APPLICABILITY

The present invention is effectively utilized in a semiconductor device equipped with a power semiconductor element, and a power conversion device to which the semiconductor device is applied.

REFERENCE SIGNS LIST 1 semiconductor device, 3 heat sink, 3a first main surface, 3b second main surface, 4a outer peripheral region, 4b inside region, 5 insulating layer, 7 lead frame, 7a lead terminal, 8 copper plate, 9 power semiconductor element, 11 bonding wire, 13 sealing resin, 15 first depression, 17 second depression, 19 screw, 21 casing, 23 fin, 25 metal conductor, 27 flat-plate fin, 29 corrugated fin, 50 mold, 51 upper mold, 51a protrusion, 51b receiving hole, 53 lower mold, 55 cavity, 61 film, 100 power supply, 200 power conversion device, 201 main conversion circuit, 202 semiconductor module, 203 control circuit, 300 load.

The invention claimed is:

1. A semiconductor device comprising:
a heat sink having a first main surface and a second main surface opposed to each other, the heat sink being formed of copper or aluminum;
a circuit pattern disposed at the first main surface of the heat sink with an insulating layer interposed;
a conductor part electrically connected to the circuit pattern;
a semiconductor element mounted on the circuit pattern and electrically connected to the circuit pattern; and
a sealing member formed on the first main surface of the heat sink to seal the semiconductor element and the circuit pattern, wherein
the conductor part is exposed from a surface located on an opposite side to a side on which the heat sink is located in the sealing member,
the sealing member is formed to cover an inside region located inside of an outer peripheral region located around an entire periphery along an outer periphery of the first main surface of the heat sink,
the outer peripheral region in the first main surface of the heat sink has a first depression located outside and in contact with a perimeter of the sealing member when viewed in a top view of the semiconductor device,
the first depression that is formed adjacent to the perimeter of the sealing member is discontinuous along its perimeter, and
the first depression is discontinuously formed with gaps interposed in a direction of extension of the first depression,
wherein the first depression is formed in an outer peripheral region in the first main surface of the heat sink, outside a position where a side surface of the sealing member is located.

2. The semiconductor device according to claim 1, wherein
the circuit pattern includes a lead frame, and
the conductor part includes a lead terminal continuous to the lead frame.

3. The semiconductor device according to claim 1, wherein
the circuit pattern includes a metal plate, and
the conductor part includes a metal conductor bonded to the metal plate.

4. The semiconductor device according to claim 1, wherein
the inside region in the first main surface of the heat sink has a second depression, and
the second depression is filled with a portion of the sealing member.

5. The semiconductor device according to claim 1, wherein the heat sink has a heat dissipation fin on the second main surface side.

6. The semiconductor device according to claim 1, wherein the insulating layer includes an inorganic material.

7. The semiconductor device according to claim 6, wherein the inorganic material is at least one of silica, alumina, silicon nitride, and aluminum nitride.

8. The semiconductor device according to claim 7, wherein the insulating layer is formed of a resin and the inorganic material is used as filler in the resin.

9. The semiconductor device according to claim 1, wherein the inside region in the first main surface of the heat sink has a second depression that has a different cross section than the first depression.

10. The semiconductor device according to claim 9, wherein the cross section of the second depression is trapezoidal.

11. The semiconductor device according to claim 4, wherein the second depression has a different cross section than the first depression.

12. The semiconductor device according to claim 11, wherein the cross section of the second depression is trapezoidal.

13. The semiconductor device according to claim 1, wherein the first depression extends away from the sealing member from a position directly below the side surface of the sealing member.

14. The semiconductor device according to claim 1, wherein the sealing member covers the inside region without filling a whole of the first depression.

15. A power conversion device comprising:
a main conversion circuit including the semiconductor device according to claim 1, the main conversion circuit converting input power and outputting the converted power; and
a control circuit to output a control signal for controlling the main conversion circuit to the main conversion circuit.

* * * * *